US009698970B1

(12) United States Patent
Cho

(10) Patent No.: US 9,698,970 B1
(45) Date of Patent: Jul. 4, 2017

(54) LOW-POWER PHASE INTERPOLATOR WITH WIDE-BAND OPERATION

(71) Applicant: Xilinx, Inc., San Jose, CA (US)

(72) Inventor: Junho Cho, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/060,342

(22) Filed: Mar. 3, 2016

(51) Int. Cl.
H03K 5/00 (2006.01)
H04L 7/033 (2006.01)
H03L 7/081 (2006.01)
H03K 5/135 (2006.01)

(52) U.S. Cl.
CPC ........... *H04L 7/0331* (2013.01); *H03K 5/135* (2013.01); *H03L 7/081* (2013.01); *H03K 2005/00052* (2013.01)

(58) Field of Classification Search
CPC ....... H03L 7/0814; H03L 7/081; H03K 5/131; H03K 5/135; H03K 2005/00052; H04L 7/0025; H04L 7/0337; H04L 7/0331
See application file for complete search history.

(56) References Cited

U.S. PATENT DOCUMENTS

| | | | |
|---|---|---|---|
| 8,184,029 B1 | 5/2012 | Hsieh et al. | |
| 8,558,596 B2 | 10/2013 | Kim et al. | |
| 8,654,823 B1 | 2/2014 | Zhu et al. | |
| 8,665,928 B1 | 3/2014 | Klein et al. | |
| 8,913,688 B1 | 12/2014 | Jenkins | |
| 8,934,594 B1 | 1/2015 | Malhotra | |
| 9,118,447 B1 | 8/2015 | Malhotra | |
| 2003/0179027 A1* | 9/2003 | Kizer | G06F 1/10 327/158 |
| 2010/0141306 A1* | 6/2010 | Doi | H03M 9/00 327/117 |
| 2010/0148842 A1* | 6/2010 | Yoon | G11C 7/22 327/295 |
| 2015/0326229 A1* | 11/2015 | Boecker | H03L 7/0814 327/158 |

OTHER PUBLICATIONS

U.S. Appl. No. 13/587,691, filed Aug. 16, 2012, Chen, Ming-Shuan entitled Phase Interpolator, San Jose, CA USA.

* cited by examiner

*Primary Examiner* — Vineeta Panwalkar
(74) *Attorney, Agent, or Firm* — Robert M. Brush; Keith Taboada

(57) ABSTRACT

An example clock delivery system includes a phase-locked loop (PLL) configured to generate a plurality of input clocks, a phase interpolator configured to receive the plurality of input clocks and generate a plurality of output clocks, and a clock data recovery (CDR) circuit configured to receive the plurality of output clocks. The phase interpolator includes a decoder having a plurality of inputs configured to receive binary codes and a respective plurality of outputs configured to output thermometer codes, and a mixer circuitry segmented into a plurality of unit circuits that are enabled or disabled based on bits of the thermometer codes.

20 Claims, 10 Drawing Sheets

US 9,698,970 B1

LOW-POWER PHASE INTERPOLATOR WITH WIDE-BAND OPERATION

TECHNICAL FIELD

Examples of the present disclosure generally relate to electronic circuits and, in particular, to a low-power phase interpolator with wide-band operation.

BACKGROUND

In a transceiver, such as a serializer/deserializer (SerDes), a dock delivery system can include a phase-locked loop (PLL) that generates multiphase dock signals. The clock signals can have phase shifts of 0, 90, 180, and 270 degrees. The generated multiphase dock signals are distributed by dock distribution buffers to a phase interpolator. The phase interpolator interpolates the dock signals to provide interpolated dock signals to a clock and data recovery (CDR) circuit, The CDR circuit uses the interpolated clock signals as sampling docks for recovering timing information from the data stream. For optimal performance, the phase interpolator should operate over a wide frequency range and achieve good linearity in terms of minimizing both differential nonlinearity (DNL) and integral nonlinearity (INL).

SUMMARY

Techniques for providing a low-power phase interpolator with wide-band operation are described. In an example, a phase interpolator circuit includes a decoder having a plurality of inputs configured to receive binary codes and a respective plurality of outputs configured to output thermometer codes. The phase interpolator circuit further includes a pre-mixer configured to receive input clock signals and provide pre-mixed clock signals, the pre-mixer segmented into a plurality of unit circuits that are enabled or disabled based on bits of a first pre-mixer thermometer code of the thermometer codes. The phase interpolator circuit further includes a mixer configured to receive the pre-mixed clock signals and provide mixed clock signals, the mixer segmented into a plurality of unit circuits that are enabled or disabled based on bits of a first mixer thermometer code of the thermometer codes. The phase interpolator circuit further includes a post-mixer configured to receive the mixed clock signals and provide output clock signals, the post-mixer segmented into a plurality of unit circuits that are enabled or disabled based on bits of a first post-mixer thermometer code of the thermometer codes.

In another example, a clock delivery system includes a phase-locked loop (PLL) configured to generate a plurality of input clocks, a phase interpolator configured to receive the plurality of input clocks and generate a plurality of output clocks, and a clock data recovery (CDR) circuit configured to receive the plurality of output clocks. The phase interpolator includes a decoder having a plurality of inputs configured to receive binary codes and a respective plurality of outputs configured to output thermometer codes, and a mixer circuitry segmented into a plurality of unit circuits that are enabled or disabled based on bits of the thermometer codes.

In another example, a method of clock phase interpolation includes converting a plurality of binary codes into a respective plurality of thermometer codes. The method further includes pre-mixing input clock signals to provide pre-mixed clock signals. The method further includes mixing the pre-mixed clock signals to provide mixed clock signals. The method further includes post-mixing the mixed clock signals to provide output clock signals. The method further includes enabling one or more pre-mixer unit circuits based on bits of a first pre-mixer thermometer code of the thermometer codes. The method further includes enabling one or more mixer unit circuits based on bits of a first mixer thermometer code of the thermometer codes. The method further includes enabling one or more post-mixer unit circuits based on bits of a first post-mixer thermometer code of the thermometer codes.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
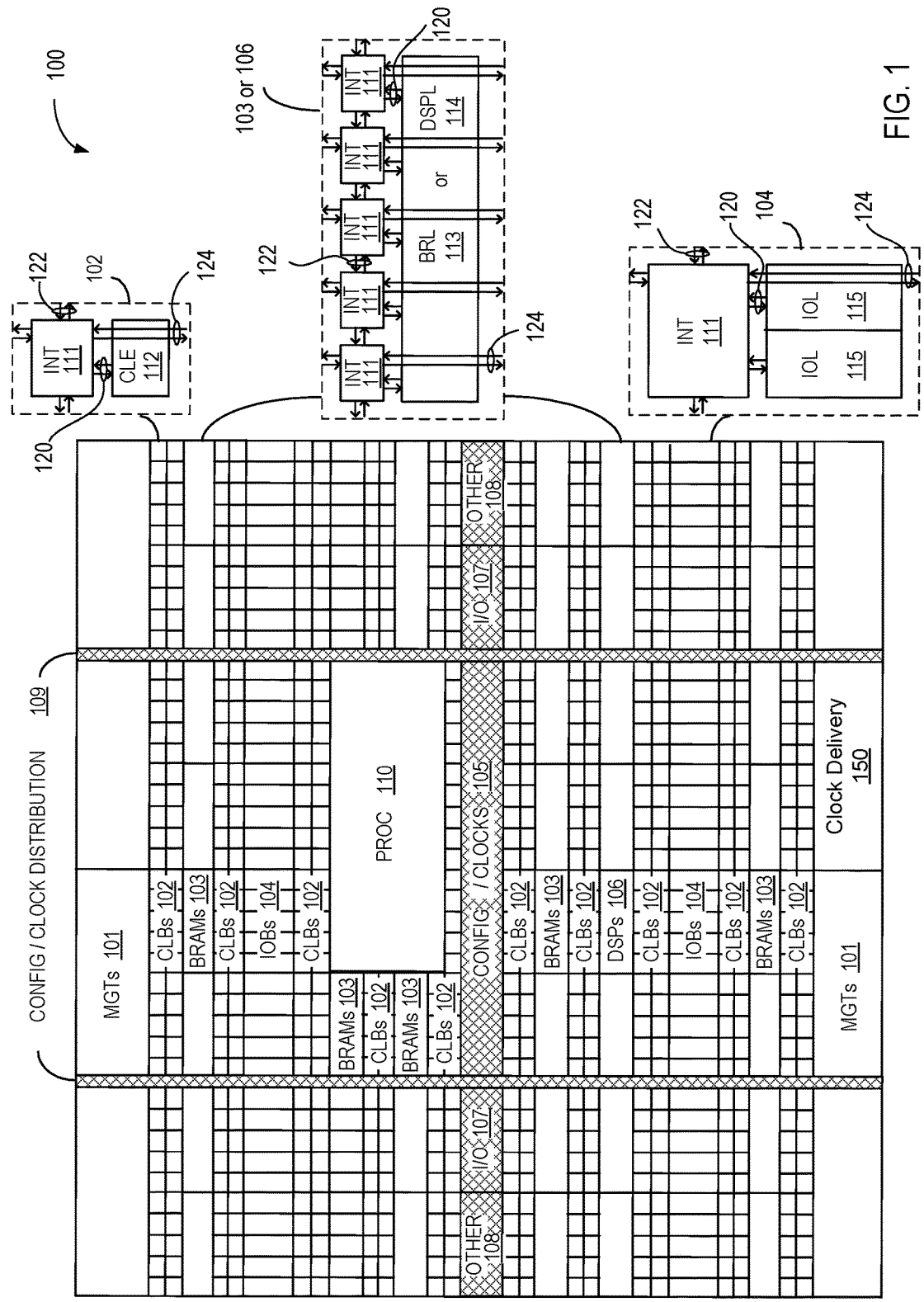
FIG. 1 illustrates an example architecture of a field programmable gate array (FPGA)

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Techniques for providing a low-power phase interpolator with wide-band operation are described. In an example, a phase interpolator includes mixer stages each segmented into a plurality of unit circuits. The unit circuits in each mixer stage are selectively enabled using a binary-to-thermometer decoder. The segmented phase interpolator provides for a wide frequency operating range. Various aspects of the segmented phase interpolator can be understood with reference to the following description of the drawings.

FIG. 1 illustrates an example architecture of an FPGA 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108, such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 (also referred to as "interconnect element 111") can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured example, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs. The processor block 110 can include various components ranging from a single microprocessor to a complete programmable processing system of microprocessor(s), memory controllers, peripherals, and the like.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. In another example, an FPGA can include an entire processing system (e.g., processor, memory, peripherals, etc.) instead of, or in addition to, the processor block 110. In such an implementation, a System-on-Chip (Soc) can include a programmable fabric (programmable logic as shown in FPGA 100) in communication with a processing system.

The FPGA 100 can include a clock delivery system 150. The clock delivery system 150 can be used to provide clock(s) to circuits in the FPGA 100 (e.g., hardened circuits and/or circuits configured in the programmable fabric). For example, the clock delivery system 150 can provide sampling clock(s) to an MGT 101. Although only one clock delivery system 150 is shown, the FPGA 100 can include multiple instances of the clock delivery system 150.

Figure 2:
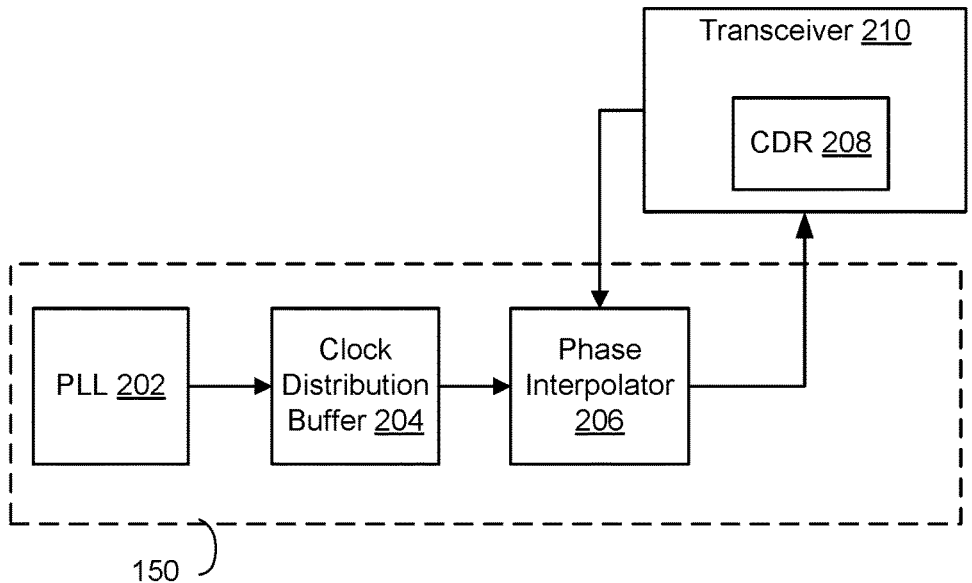
FIG. 2 is a block diagram depicting an example of a clock delivery system.

FIG. 2 is a block diagram depicting an example of the clock delivery system 150. The clock delivery system 150 includes a phase locked loop (PLL) 202, a clock distribution buffer 204, and a phase interpolator 206. The clock delivery system 150 can be coupled to a transceiver 210 having a clock data recovery (CDR) circuit 208. The clock delivery system 150 generates clocks for use by the CDR circuit 208 in the transceiver 210.

The PLL 202 is configured to generate a plurality of clocks. The clocks can have different phases (e.g., 0, 90, 180, and 270 degree relative phases). The clocks generated by the PLL 202 are referred to variously as "input clocks" or "PLL clocks" depending on the context. An output of the PLL 202 is coupled to the clock distribution buffer 204 to provide the PLL clocks. An output of the clock distribution buffer 204 is coupled to an input of the phase interpolator 206. The clock distribution buffer 204 buffers the PLL clocks and couples the PLL clocks to the phase interpolator 206.

The phase interpolator 206 generates output clocks from the PLL clocks. The clocks generated by the phase interpolator 206 are referred to variously as output clocks or phase interpolated clocks. The phase interpolator 206 generates the output clocks having an arbitrary phase under control of the transceiver 210. An example structure of the phase interpolator 206 is described further below. While the clock delivery system 150 is shown as being coupled to a transceiver, the clock delivery system 150 can be used to generate clocks for other types of circuits.

Figure 3:
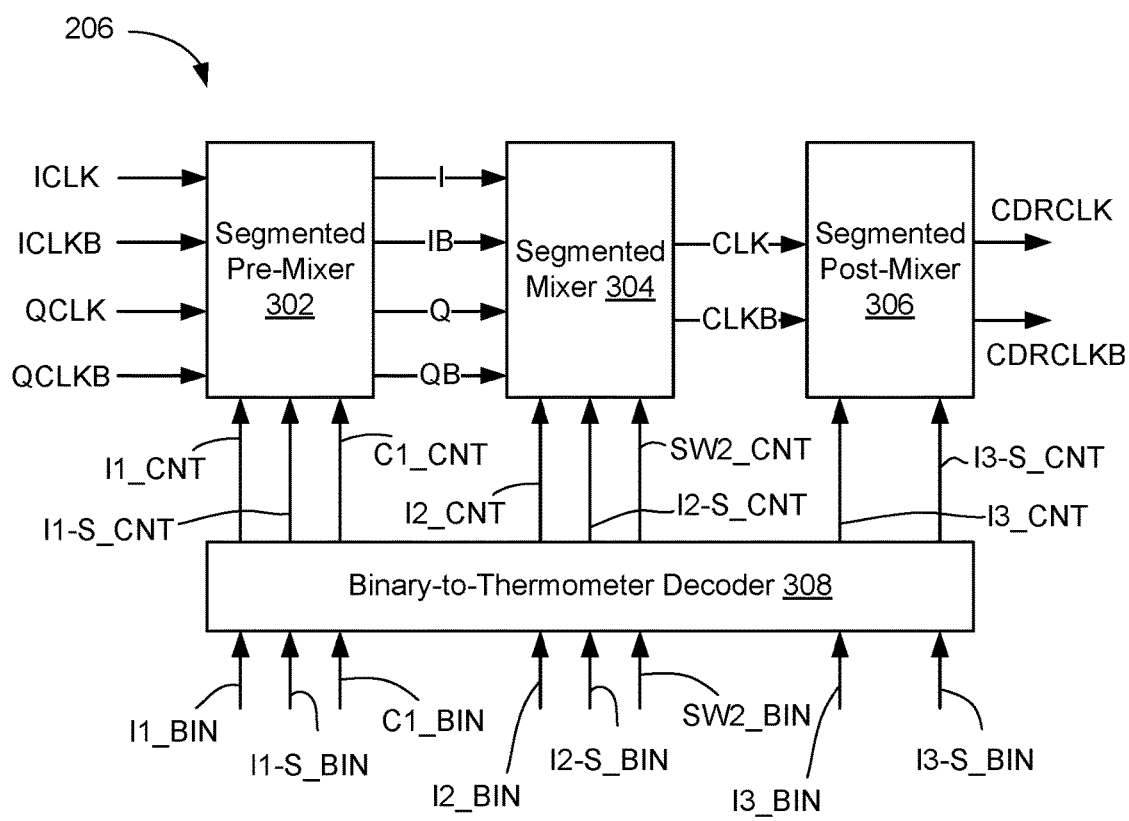
FIG. 3 is a block diagram depicting a phase interpolator according to an example.

FIG. 3 is a block diagram depicting the phase interpolator 206 according to an example. The phase interpolator 206 includes a segmented pre-mixer 302, a segmented mixer 304, a segmented post-mixer 306, and a binary-to-thermometer decoder 308. The segmented pre-mixer 302, the segmented mixer 304, and the segmented post-mixer 306 are also referred to as a pre-mixer, mixer, and post-mixer, respectively. The binary-to-thermometer decoder 308 is also referred to as a decoder.

Inputs of the segmented pre-mixer 302 receive input clock signals (e.g., PLL clock signals) through the clock distribution buffer 204. In the example shown, the segmented pre-mixer 302 receive four clock signals referred to as ICLK, ICLKB, QCLK, and QCLKB. The clocks ICLK, QCLK, ICLKB, and QCLKB can have phases of 0, 90, 180, and 270 degrees, respectively. The segmented pre-mixer 302 processes the input clocks for the segmented mixer 304 to interpolate. The segmented pre-mixer 302 adjusts the slew-rate of the input clocks and performs waveform shaping. As described further below, the segmented pre-mixer 302 is segmented into a plurality of unit circuits allowing for segmented control of slew-rate and voltage swing. The segmented pre-mixer 302 generates output clocks, referred to as "pre-mixed clocks." Outputs of the segmented pre-mixer 302 are coupled to inputs of the segmented mixer 304 to provide the pre-mixed clocks. The pre-mixed clocks are referred to as I, Q, IB, and QB clocks having phases of 0, 90, 180, and 270 degrees.

The segmented mixer 304 interpolates the pre-mixed clocks to generated output clocks referred to as "mixed clocks." Similar to the segmented pre-mixer 302, the segmented mixer 304 is segmented into a plurality of unit circuits allowing for segmented control of the phase interpolation. Outputs of the segmented mixer 304 are coupled to inputs of the segmented post-mixer 306 to provide the mixed clocks. The mixed clocks are referred to as CLK and CLKB. The clock CLK has an arbitrary phase and the clock CLKB is 180 degrees out of phase with the clock CLK.

The segmented post-mixer 306 buffers the mixed clocks for converting the swing level from one voltage domain to another. The segmented post-mixer 306 performs the function of a limiting amplifier and a level shifter. The segmented post-mixer 306 is also segmented into a plurality of unit circuits allowing for segmented control of the post-processing function. Outputs of the segmented post-mixer 306 provide the output clocks of the phase interpolator 206. The output clocks in the example are shown as CDRCLK and CDRCLKB for use by the CDR circuit 208.

The decoder 308 includes a plurality of inputs and a plurality of outputs. The inputs of the decoder 308 are divided into pre-mixer inputs, mixer inputs, and post-mixer inputs. The pre-mixer inputs are designated as I1_BIN, I1-S_BIN, and C1_BIN. The mixer inputs are designated as I2_BIN, I2-S_BIN, and SW2_BIN. The post-mixer inputs are designated as I3_BIN and I3-S_BIN. Likewise, the outputs of the decoder 308 are divided into pre-mixer outputs, mixer outputs, and post-mixer outputs. The pre-mixer outputs are designated I1_CNT, I1-S_CNT, and C1_CNT. The mixer outputs are designated I2_CNT, I2-S_CNT, and SW2_CNT. The post-mixer outputs are designated I3_CNT and I3-S_CNT. The inputs of the decoder 308 receive binary codes having a width M, where M is a positive integer greater than zero. The outputs of the decoder 308 provide thermometer codes having a width of N, where $N=2^M$. The decoder 308 decodes each binary code into a corresponding thermometer code. For example, if M=3, then the decoder 308 can map the binary codes to thermometer codes as follows:

| Binary Code (M = 3) | Thermometer Code (N = 8) |
|---|---|
| 000 | 00000001 |
| 001 | 00000011 |
| 010 | 00000111 |
| 011 | 00001111 |
| 100 | 00011111 |
| 101 | 00111111 |
| 110 | 01111111 |
| 111 | 11111111 |

The width M of each input to the decoder 308 and the width N of the thermometer codes can be different from one input to another and from one thermometer code to another.

The segmented pre-mixer 302 receives three different thermometer codes. A first thermometer code I1_CNT controls the number of enabled unit circuits. A second thermometer code I1-S_CNT controls a number of enabled sub-range current sources within each unit circuit, as described below. A third thermometer code C1_CNT controls a number of enabled load capacitors in each unit circuit, as described below.

The segmented mixer 304 receives three different thermometer codes. A first thermometer code I2_CNT controls the number of enabled unit circuits. A second thermometer code I2-S_CNT controls a number of enabled sub-range current sources within each unit circuit, as described below. A third thermometer code R1_CNT controls a number of enabled load resistors, as described below.

The segmented post-mixer 306 receives two different thermometer codes. A first thermometer code I3_CNT controls the number of enabled unit circuits. A second thermometer code I3-S_CNT controls a number of enabled sub-range current sources within each unit circuit, as described below.

For each of the mixer circuits, the number of enabled unit circuits is controlled by the number of set bits in the respective first thermometer codes, such as I1_CNT, I2_CNT, and I3_CNT. As described below, the unit circuits are enabled by activating a main current source. The number of enabled unit circuits determines a coarse frequency range of the phase interpolator 206. For each of the mixer circuits, the number of enabled sub-range current sources in each unit circuit is controlled by the number of set bits in the respective second thermometer codes, such as I1-S_CNT, I2-S_CNT, and I3-S_CNT. The number of enabled sub-range current sources in each unit circuit determines a fine frequency range of the phase interpolator 206. For the pre-mixer 302, the number of enabled load capacitors is controlled by the number of set bits in the respective third thermometer code (e.g., C1_CNT). The number of enabled load capacitors in each unit circuit controls the slew-rate and waveform shape. For the mixer 304, the number of enabled load resistors is controlled by the number of set bits in the respective third thermometer code (e.g., SW2_CNT). The number of enabled load resistors controls the gain and output common mode level of the mixer 304. The input binary codes are used to control the phase interpolator 206 as follows:

| Input Signal | Usage |
|---|---|
| I1_BIN | Main current source control for pre-mixer output swing |
| I2_BIN | Main current source control for mixer output swing |
| I3_BIN | Main current source control for post-mixer output swing |

| Input Signal | Usage |
|---|---|
| I1-S_BIN | Sub-range current source control for pre-mixer output swing I1-S_BIN is 0 when I1_BIN = 0 |
| I2-S_BIN | Sub-range current source control for mixer output swing I2-S_BIN is 0 when I2_BIN = 0 |
| I3-S_BIN | Sub-range current source control for post-mixer output swing I3-S_BIN is 0 when I3_BIN = 0 |
| C1_BIN | Slew-rate and wave shape control for pre-mixer output C1_BIN is 0 when I1_BIN = 0 |
| SW2_BIN | Resistive load control for mixer |

As described in the table above, the sub-range current sources are enabled only if the respective main current source is enabled. Thus, the sub-range current sources are gated by the respective main current sources.

Figure 4:
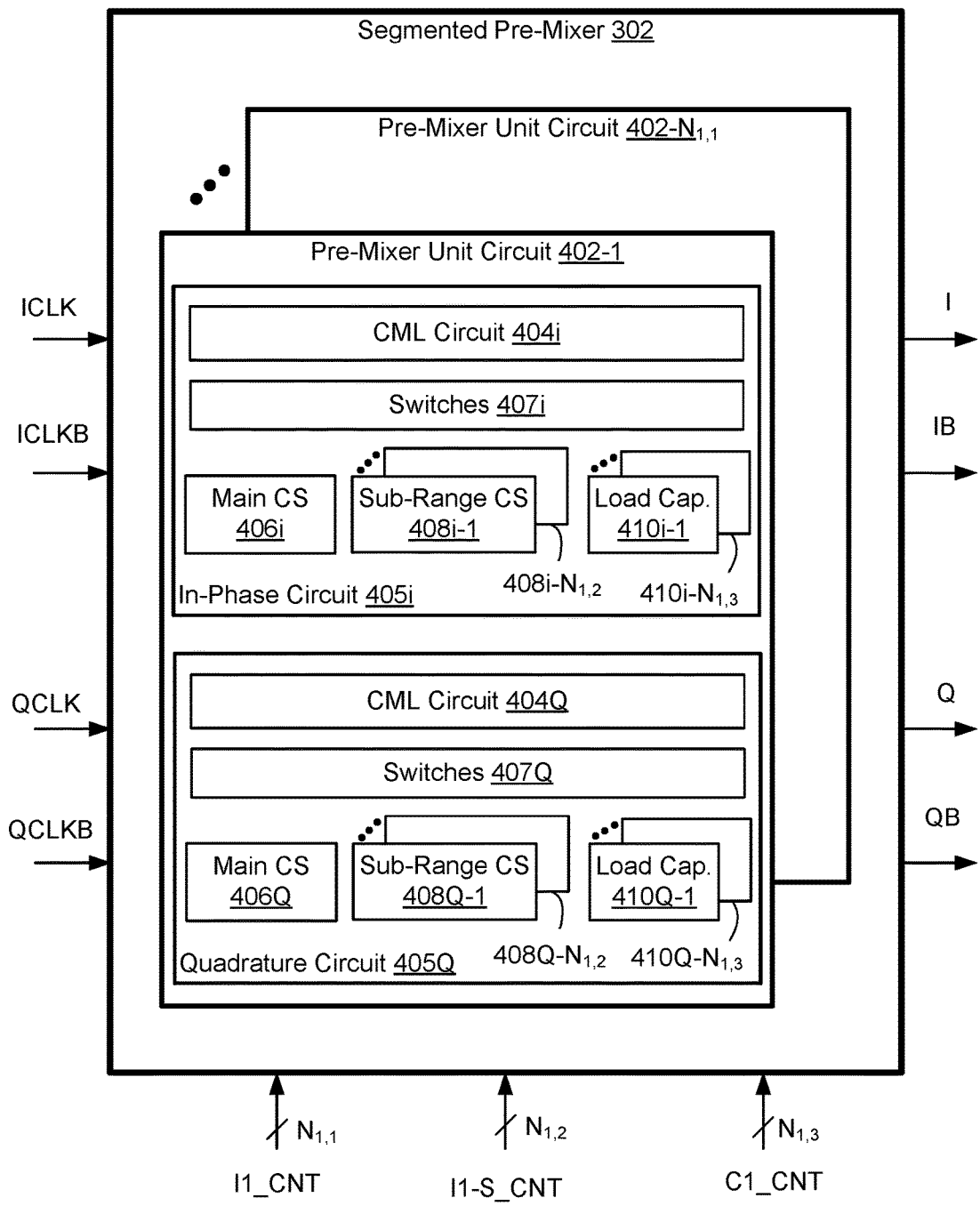
FIG. 4 is a block diagram depicting a segmented pre-mixer according to an example.

FIG. 4 is a block diagram depicting the segmented pre-mixer 302 according to an example. The pre-mixer 302 includes pre-mixer unit circuits 402-1 through 402-$N_{1,1}$ (collectively referred to as pre-mixer unit circuits 402). Thus, the pre-mixer 302 includes one unit circuit 402 for each bit of the first thermometer code I1_CNT (e.g., having a width of $N_{1,1}$). Each unit circuit 402 includes an in-phase circuit 405$i$ and a quadrature circuit 405Q (collectively referred to as circuits 405). The in-phase circuit 405$i$ processes the input clocks ICLK and ICLKB and generates the pre-mixed clocks I and IB. The quadrature circuit 405Q processes the input clocks QCLK and QCLKB and generates the pre-mixed clocks Q and QB.

Each of the circuits 405 includes the same structure. The in-phase circuit 405$i$ includes a current-mode logic (CML) circuit 404$i$, switches 407$i$, a main current source (CS) 406$i$, sub-range current sources 408$i$-1 through 408$i$-$N_{1,2}$ (collectively referred to as sub-range current sources 408$i$), and load capacitors 410$i$-1 through 410$i$-$N_{1,3}$ (collectively referred to as load capacitors 410$i$). The sub-range current sources 408$i$ can be implemented using a segmented current source, and the load capacitors 410$i$ can be implemented using a segmented capacitor bank. The switches 407$i$ are used to enable or disable the main current source 406$i$ based on the bits in the thermometer code I1_CNT. The switches 407$i$ are used to enable or disable the sub-range current sources 408$i$ based on the bits of the thermometer code I1-S_CNT (e.g., having a width of $N_{1,2}$). The switches 407$i$ are used to enable or disable the load capacitors 410$i$ based on the bits of the thermometer code C1_CNT (e.g., having a width of $N_{1,3}$).

The quadrature circuit 405Q includes a current-mode logic (CML) circuit 404Q, switches 407Q, a main current source 406Q, sub-range current sources 408Q-1 through 408Q-$N_{1,2}$ (collectively referred to as sub-range current sources 408Q), and load capacitors 410Q-1 through 410Q-$N_{1,3}$ (collectively referred to as load capacitors 410Q). The sub-range current sources 408Q can be implemented using a segmented current source, and the load capacitors 410Q can be implemented using a segmented capacitor bank. The switch 407Q operates identically to the switch 407$i$ in the in-phase circuit 405$i$ described above.

In operation, the thermometer code I1_CNT enables one or more of the pre-mixer unit circuits 402 by activating the main current sources 406$i$ and 406Q therein. Each enabled unit circuit 402 operates on the input clocks and the output clocks in parallel. This provides for coarse frequency control. The thermometer code I1-S_CNT enables one or more sub-range current sources 408 in each circuit 405 of the enabled unit circuits 402. Since sub-range current sources 408 are gated by their respective main current source 406, sub-range current sources 408 in disabled unit circuits 402 are not active. Sub-range current sources 408 provide for fine frequency control. The thermometer code C1_CNT enables one or more load capacitors 410 in each circuit 405 of the enabled unit circuits 402. Load capacitors 410 provide for slew-rate and waveform shaping control.

Figure 5:
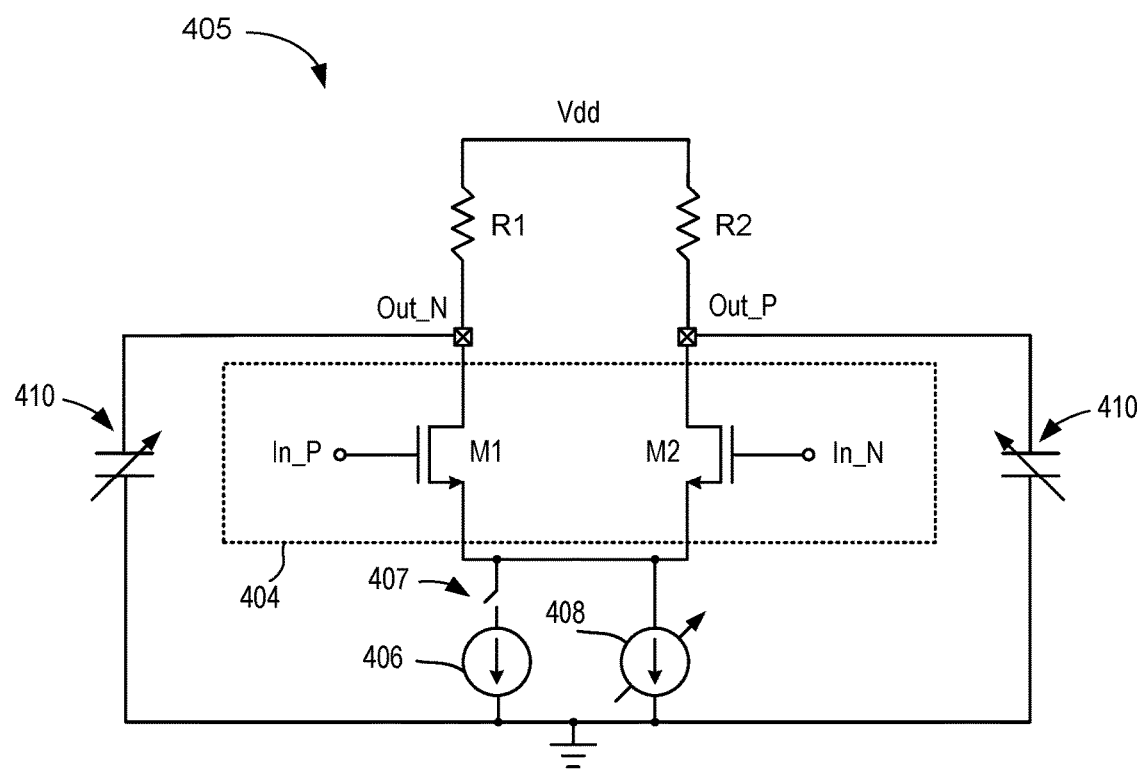
FIG. 5 is a schematic diagram depicting a unit circuit according to an example.

FIG. 5 is a schematic diagram depicting a circuit 405 according to an example. The CML circuit 404 includes a source coupled differential transistor pair M1, M2. The transistors M1 and M2 are N-channel field effect transistors (FETs), such as N-type metal oxide semiconductor FETs (MOSFETs). Gates of the transistors M1 and M2 receive input signals In_P and In_N, respectively. The input signals can be a pair of in-phase clocks or quadrature clocks. Sources of the transistors M1 and M2 are coupled together. Drains of the transistors M1 and M2 are coupled to resistors R1 and R2, respectively. The resistors R1 and R2 are coupled between a supply voltage Vdd and the transistor drains. The drain of the transistor M1 provides an output Out_N, and the drain of the transistor M2 provides an output Out_P.

The main current source 406 is coupled to the transistor sources through a switch 407. The sub-range current sources 408 are also coupled to the transistors sources in parallel with the main current source 406. The load capacitors 410 are coupled between the outputs Out-N and Out_P and a reference voltage (e.g., electrical ground). The main current source 406 and the sub-range current sources 408 are also coupled to the reference voltage. The sub-range current sources 408 can be implemented using a segmented current source. The load capacitors 410 can be implemented using a segmented capacitor bank. For clarity, the switches 407 for the sub-range current sources 408 and the load capacitors 410 are not shown.

Figure 6:
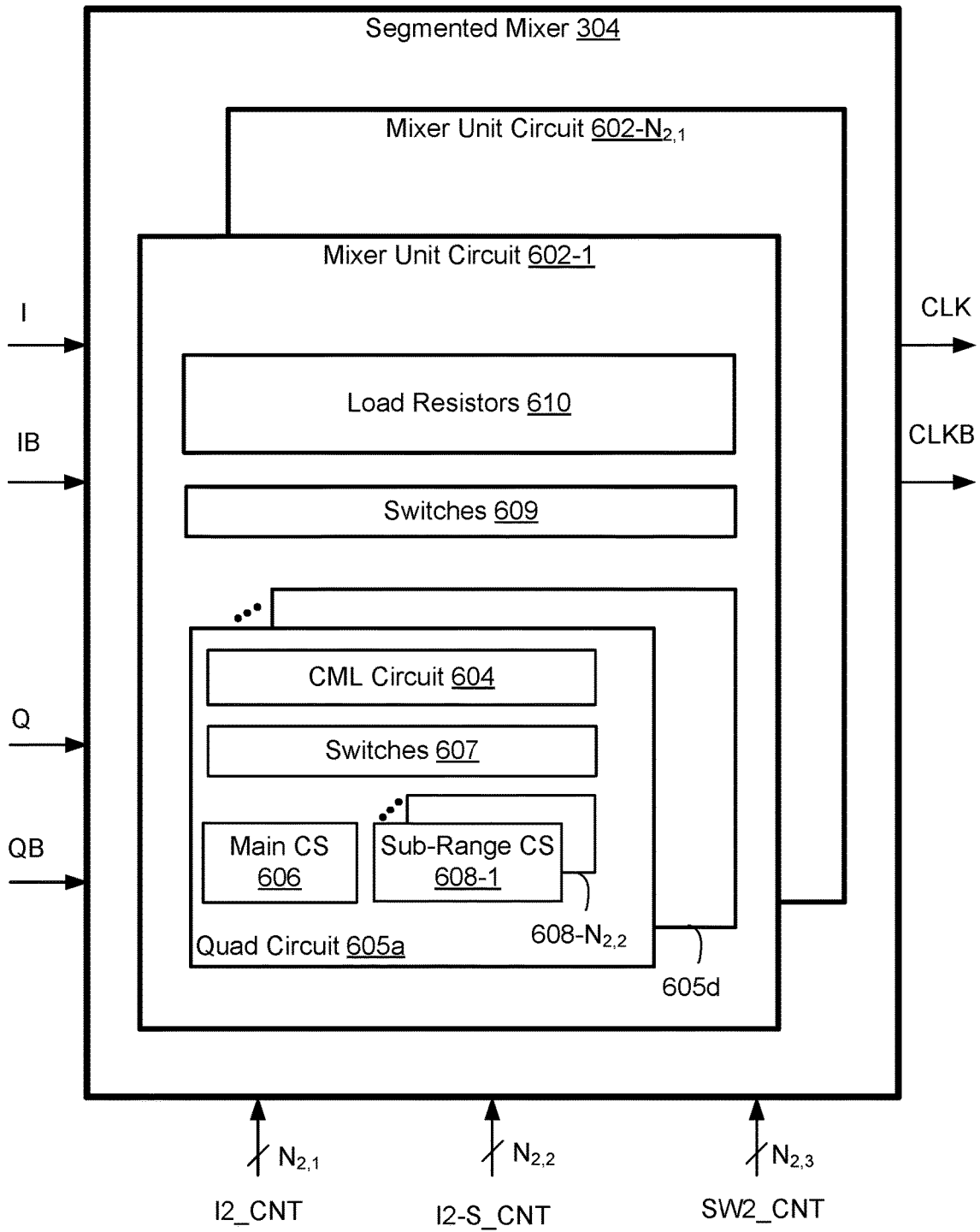
FIG. 6 is a block diagram depicting a segmented mixer according to an example.

FIG. 6 is a block diagram depicting the segmented mixer 304 according to an example. The mixer 304 includes mixer unit circuits 602-1 through 602-$N_{2,1}$ (collectively referred to as mixer unit circuits 602). Thus, the mixer 304 includes one unit circuit 602 for each bit of the first thermometer code I2_CNT (e.g., having a width of $N_{2,1}$). Each unit circuit 602 includes four quad circuits 605$a$ through 605$d$ (respectively quad circuits 605). The quad circuit 605$a$ processes the differential clock I-IB, the quad circuit 605$b$ processes the differential clock IB-I, the quad circuit 605$c$ processes the differential clock Q-QB, and the quad circuit 605$d$ processes the differential clock QB-Q. The quad circuits 605 collectively generate the mixed clocks CLK and CLKB as a differential clock CLKB-CLK.

Each of the quad circuits 605 includes the same structure. Each quad circuit 605 includes a CML circuit 604, switches 607, a main current source (CS) 606, and sub-range current sources 608-1 through 608-$N_{2,2}$ (collectively referred to as sub-range current sources 608). The sub-range current sources 608 can be implemented using a segmented current source. The switches 607 are used to enable or disable the main current source 606 based on the bits in the thermometer code I2_CNT. The switches 607 are used to enable or disable the sub-range current sources 608 based on the bits of the thermometer code I2-S_CNT (e.g., having a width of $N_{2,2}$). Each unit circuit 602 also includes load resistors 610 and switches 609. The switches 609 are used to enable or disable the load resistors 610 based on the bits of the thermometer code SW2_CNT (e.g., having a width of $N_{2,3}$).

In operation, the thermometer code I2_CNT enables one or more of the mixer unit circuits 602 by activating the main current sources 606 therein. Each enabled unit circuit 602 operates on the input clocks and the output clocks in parallel. This provides for coarse frequency control. The thermometer code I2-S_CNT enables one or more sub-range current sources 608 in each quad circuit 605 of the enabled unit circuits 602. Since sub-range current sources 608 are gated by their respective main current source 606, sub-range current sources 608 in disabled unit circuits 602 are not active. Sub-range current sources 608 provide for fine frequency control. The thermometer code SW2_CNT enables or disables the load resistors 610 in each unit circuit 602. As described below, the enabled load resistors 610 provide a collective load for the parallel combination of the enabled unit circuits 602.

Figure 7:
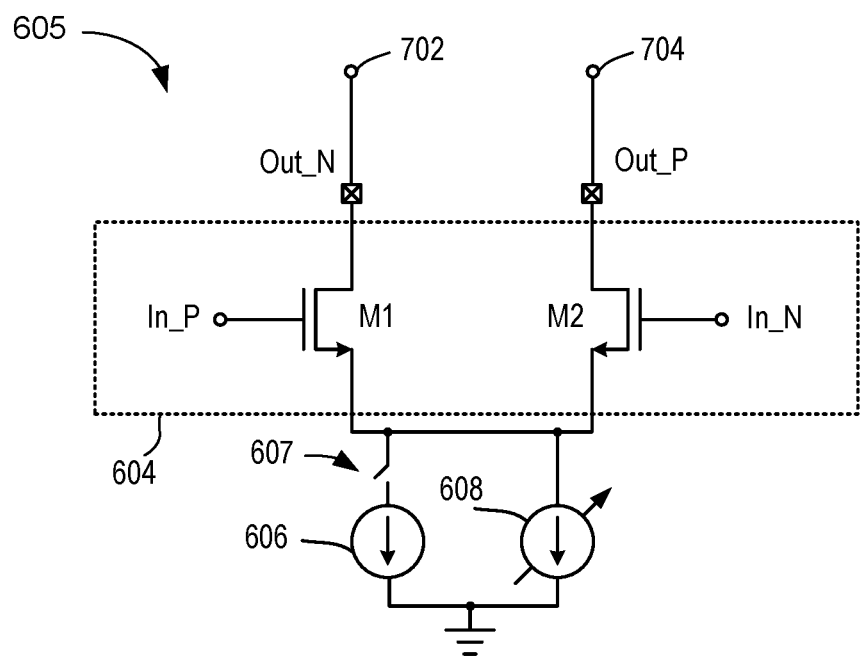
FIG. 7 is a schematic diagram depicting a quad circuit according to an example.

FIG. 7 is a schematic diagram depicting a quad circuit 605 according to an example. The CML circuit 604 incudes a source coupled differential transistor pair M1, M2. The transistors M1 and M2 are N-channel FETs. Gates of the transistors M1 and M2 receive input signals In_P and In_N, respectively. The input signals can be a pair of in-phase clocks or quadrature clocks. Sources of the transistors M1 and M2 are coupled together. Drains of the transistors M1 and M2 are coupled to output nodes 702 and 704, respectively. The drain of the transistor M1 provides an output Out_N, and the drain of the transistor M2 provides an output Out_P.

The main current source 606 is coupled to the transistor sources through a switch 607. The sub-range current sources 608 are also coupled to the transistors sources in parallel with the main current source 606. The main current source 606 and the sub-range current sources 608 are also coupled to the reference voltage. The sub-range current sources 608 can be implemented using a segmented current source. For clarity, the switches 607 for the sub-range current sources 608 are not shown.

Figure 8:
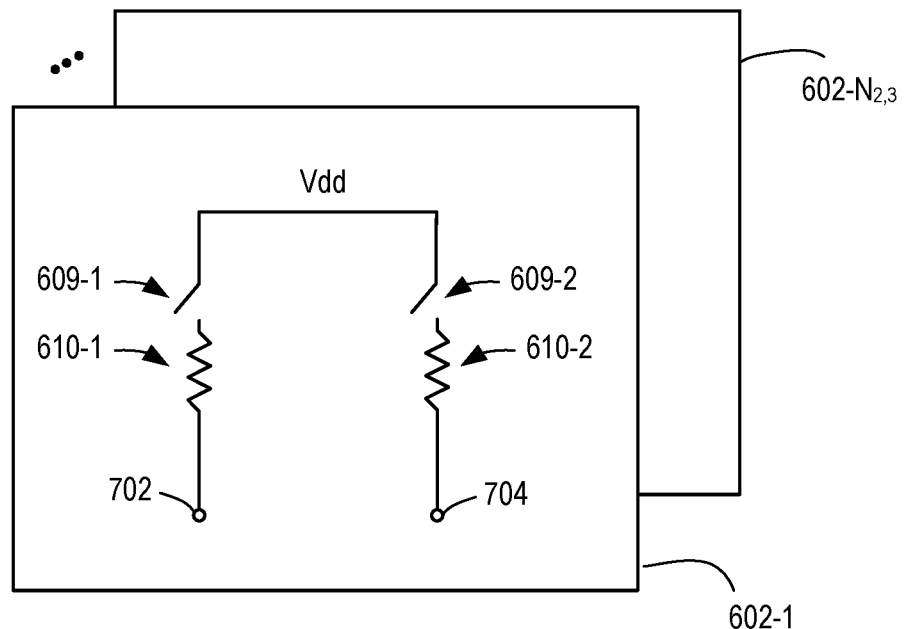
FIG. 8 is a schematic diagram depicting load resistors according to an example.

FIG. 8 is a schematic diagram depicting the load resistors 610 according to an example. Each unit circuit 602 includes a pair of load resistors 610-1 and 610-2. The load resistor 610-1 is coupled between the node 702 and a switch 609-1. The load resistor 610-2 is coupled between the node 704 and a switch 609-2. t. The switches 609-1 and 609-2 selectively couple the load resistors 610-1 and 610-2 to Vdd. One or more pairs of the resistors 610-1 and 610-2 can be enabled by the thermometer code SW2_CNT to provide a collective load for the parallel combination of enabled unit circuits 602.

Figure 9:
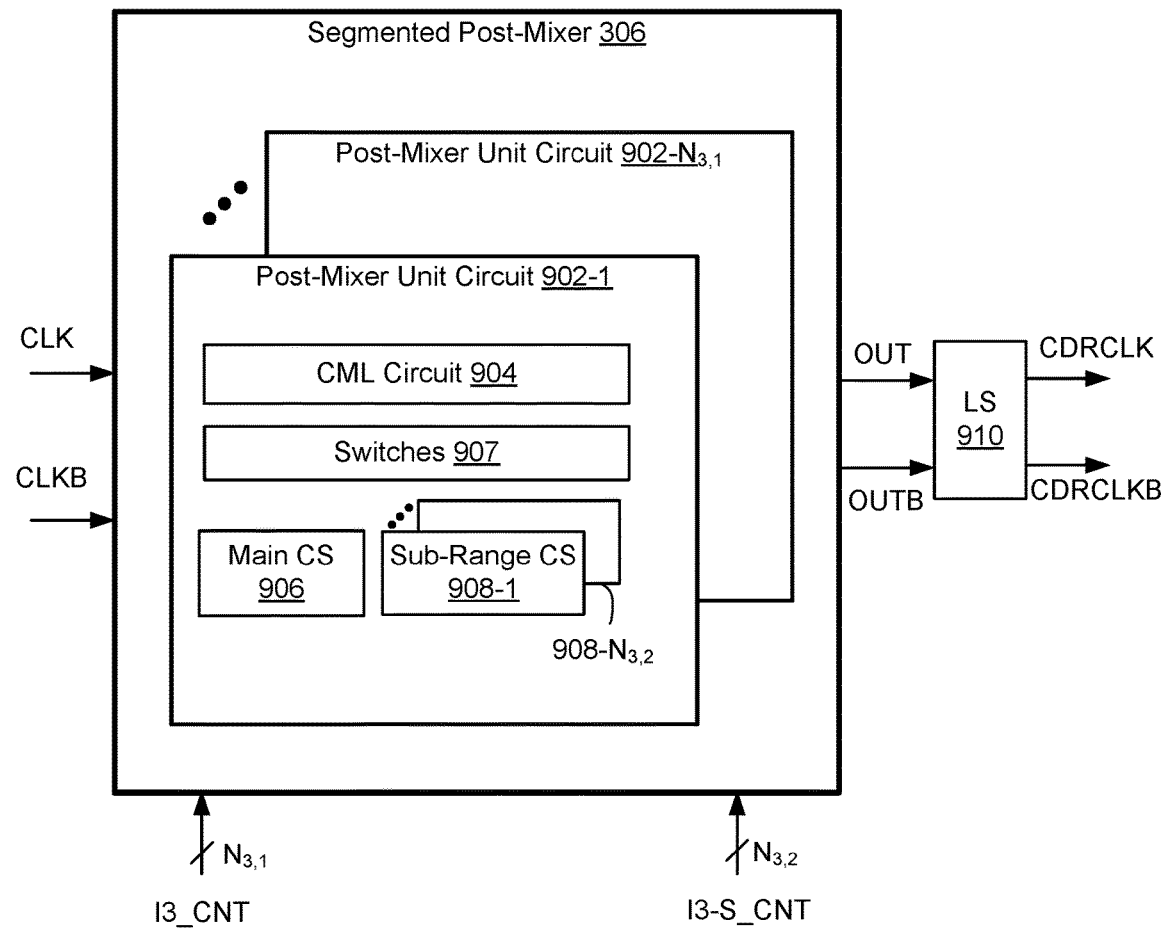
FIG. 9 is a block diagram depicting a segmented post-mixer according to an example.

FIG. 9 is a block diagram depicting the segmented post-mixer 306 according to an example. The post-mixer 306 includes post-mixer unit circuits 902-1 through 902-$N_{3,1}$ (collectively referred to as post-mixer unit circuits 902). Thus, the post-mixer 306 includes one unit circuit 902 for each bit of the first thermometer code I3_CNT (e.g., having a width of $N_{3,1}$). Each unit circuit 902 includes a CML circuit 904, switches 907, a main current source (CS) 906, and sub-range current sources 908-1 through 908-$N_{3,2}$ (collectively referred to as sub-range current sources 908). The sub-range current sources 908 can be implemented using a segmented current source. The switches 907 are used to enable or disable the main current source 906 based on the bits in the thermometer code I3_CNT. The switches 907 are used to enable or disable the sub-range current sources 908 based on the bits of the thermometer code I3-S_CNT (e.g., having a width of $N_{3,2}$).

In operation, the thermometer code I3_CNT enables one or more of the post-mixer unit circuits 902 by activating the main current source 906 therein. Each enabled unit circuit 902 operates on the input clocks and the output clocks in parallel. This provides for coarse frequency control. The thermometer code I3-S_CNT enables one or more sub-range current sources 908 in each of the unit circuits 902. Since sub-range current sources 908 are gated by their respective main current source 906, sub-range current sources 908 in disabled unit circuits 902 are not active. Sub-range current sources 908 provide for fine frequency control.

The post-mixer 306 generates output clock signals OUT and OUTB, which are coupled to a level-shifter (LS) 910. The level-shifter 910 adjusts the voltage domain of the output clocks and generates the clocks CDRCLK and CDRCLKB.

Figure 10:
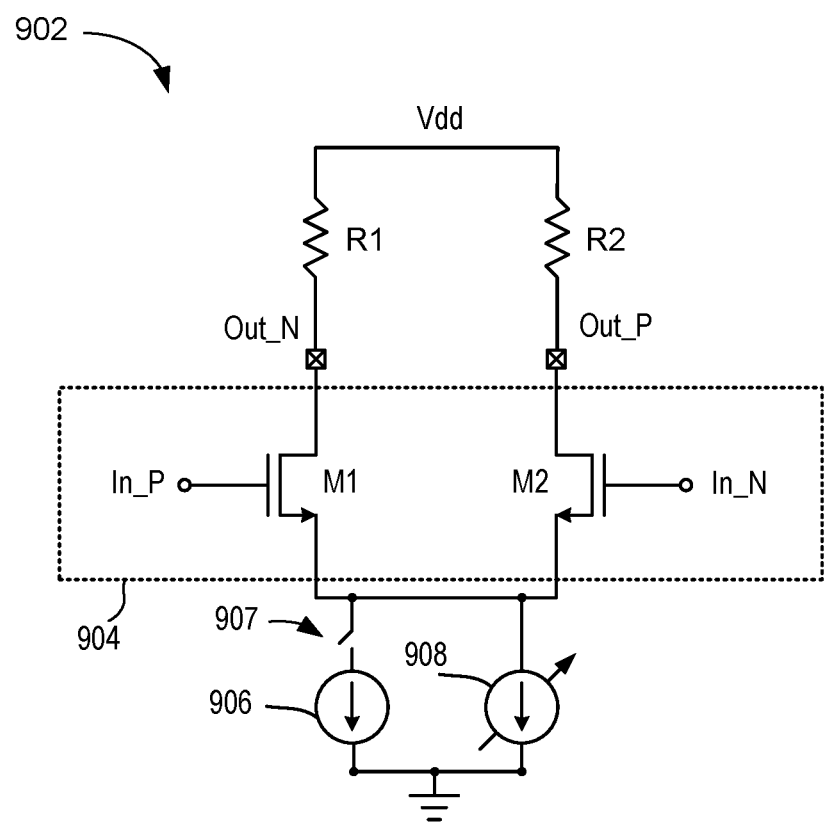
FIG. 10 is a schematic diagram depicting a unit circuit according to an example.

FIG. 10 is a schematic diagram depicting a unit circuit 902 according to an example. The CML circuit 904 incudes a source coupled differential transistor pair M1, M2. The transistors M1 and M2 are N-channel FETs. Gates of the transistors M1 and M2 receive input signals In_P and In_N, respectively. The input signals can be a pair of mixer output clocks. Sources of the transistors M1 and M2 are coupled together. Drains of the transistors M1 and M2 are coupled to resistors R1 and R2, respectively. The drain of the transistor M1 provides an output Out_N, and the drain of the transistor M2 provides an output Out_P. The resistors R1 and R2 are coupled between the supply voltage Vdd and the transistor drains.

The main current source 906 is coupled to the transistor sources through a switch 907. The sub-range current sources 908 are also coupled to the transistors sources in parallel with the main current source 906. The main current source 906 and the sub-range current sources 908 are also coupled to the reference voltage. The sub-range current sources 908 can be implemented using a segmented current source. For clarity, the switches 907 for the sub-range current sources 908.

Figure 11:
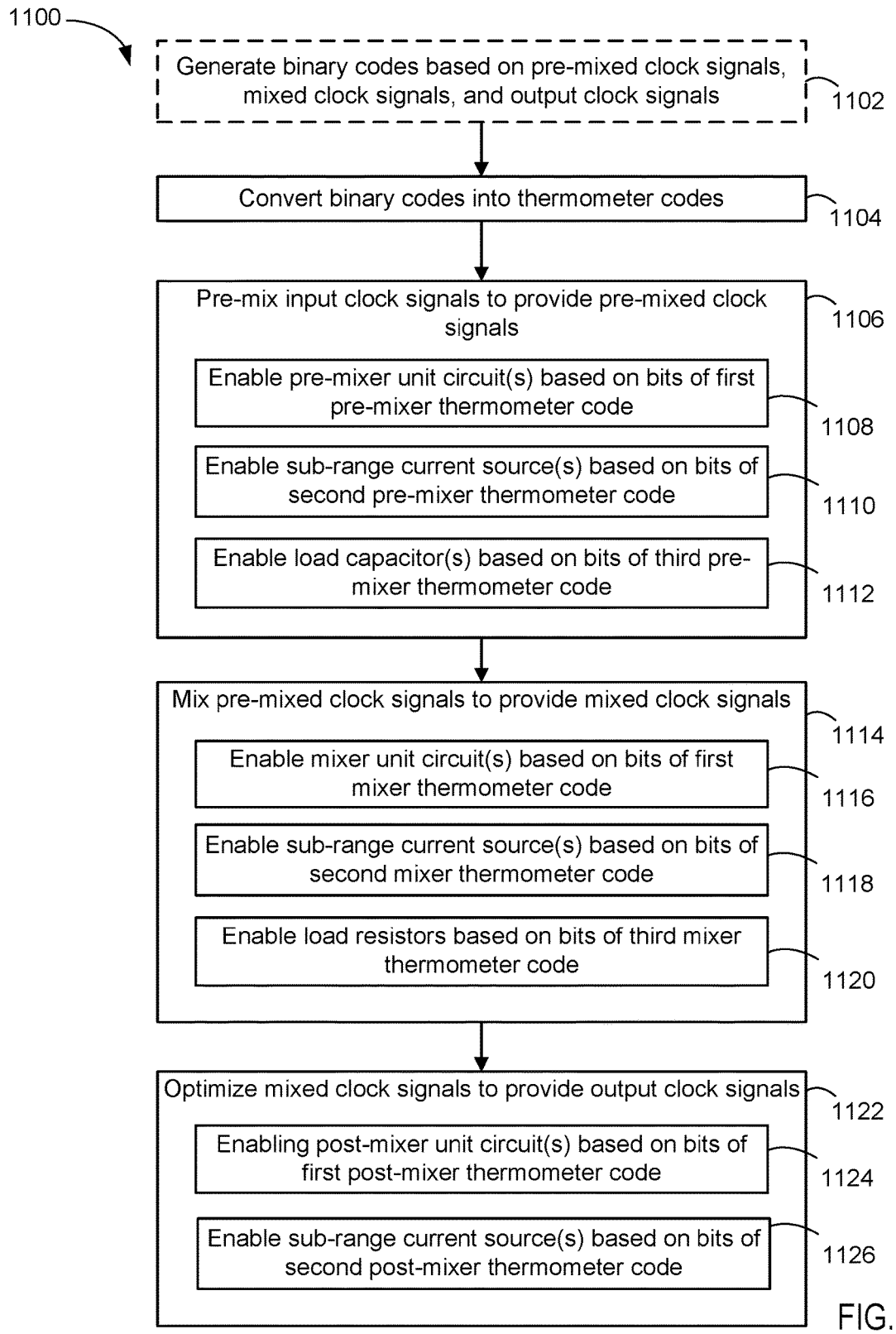
FIG. 11 is a flow diagram depicting a method of phase interpolation according to an example.

FIG. 11 is a flow diagram depicting a method 1100 of phase interpolation according to an example. The method 1100 may be performed by the phase interpolator 206 described above. In an example, the method 1100 begins at step 1104, where the decoder 308 converts the input binary codes to thermometer codes. At step 1106, the pre-mixer 302 pre-mixes the input clock signals to provide pre-mixed clock signals. At step 1108, the decoder 308 enables pre-mixer unit circuits 402 based on bits of a first pre-mixer thermometer code (I1_CNT). At step 1110, the decoder 308 enables sub-range current source(s) 408 based on bits of a second pre-mixer thermometer code (I1-S_CNT). At step 1112, the decoder 308 enables load capacitors 410 based on bits of a third pre-mixer thermometer code (C1_CNT).

At step 1114, the mixer 304 mixes the pre-mixed clock signals to provide mixed clock signals. At step 1116, the decoder 308 enables mixer unit circuits 602 based on bits of a first mixer thermometer code (I2_CNT). At step 1118, the decoder 308 enables sub-range current source(s) 608 based on bits of a second mixer thermometer code (I2-S_CNT). At step 1120, the decoder 308 enables load resistors 610 based on bits of a third mixer thermometer code (SW2_CNT).

At step 1122, the post-mixer 306 optimizes the mixed clock signals to provide the output clock signals. At step 1124, the decoder 308 enables post-mixer unit circuits 902 based on bits of a first post-mixer thermometer code (I3_CNT). At step 1126, the decoder 308 enables sub-range current source(s) 908 based on bits of a second post-mixer thermometer code (I3-S_CNT).

Figure 12:
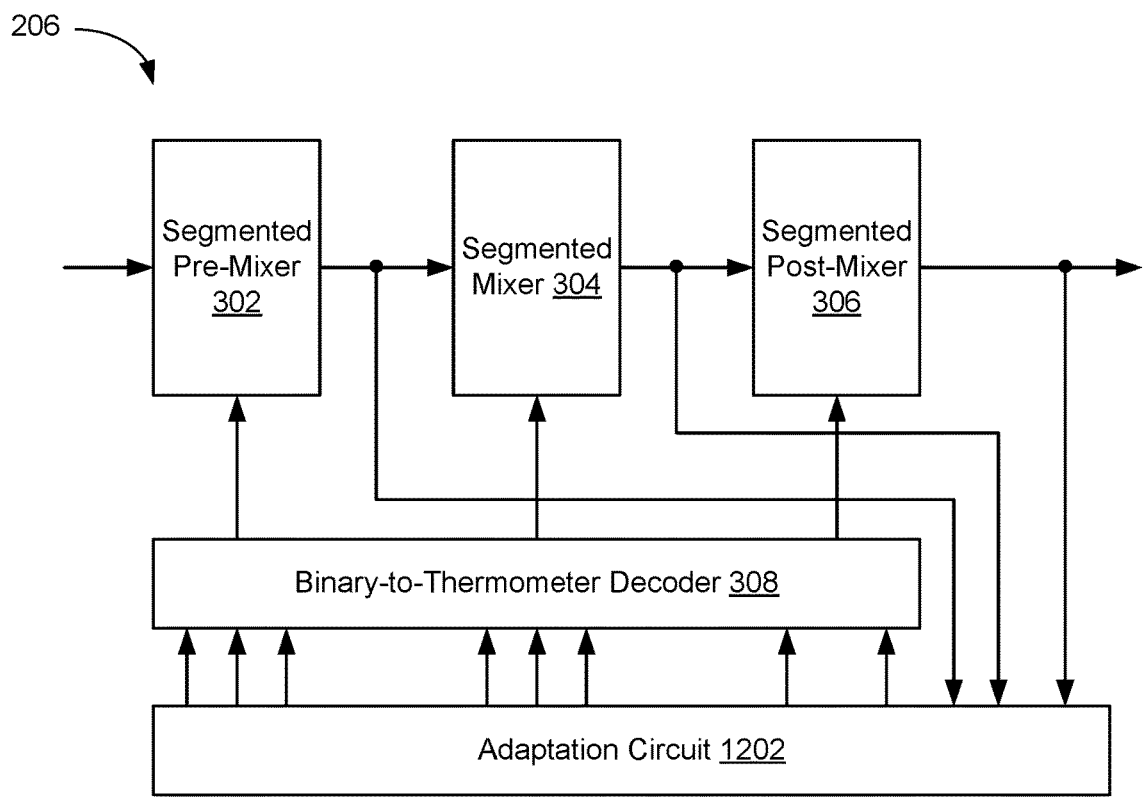
FIG. 12 is a block diagram depicting another example of a phase interpolator.

FIG. 12 is a block diagram depicting another example of the phase interpolator 206. The phase interpolator 206 is configured identically as shown in FIG. 2 with the addition of the adaptation circuit 1202. Specific details of the phase interpolator 206 are omitted for clarity. The adaptation circuit 1202 is configured to receive the pre-mixed clocks, mixed clocks, and output clocks. In response, the adaptation circuit 1202 is configured to generate the binary codes for controlling the phase interpolator 206. In an embodiment, the method 1100 includes a step 1102, where the adaptation circuit 1202 generates the binary codes based on the mixer outputs. For example, the adaptation circuit 1202 can include a lookup table used to set the values of the binary codes based on attributes of the pre-mixed clocks, mixed clocks, and output clocks. In an example, the functionality of the binary-to-thermometer decoder 308 can be incorporated into the adaptation circuit 1202.

While the foregoing is directed to specific examples, other and further examples may be devised without departing from the basic scope thereof, and the scope thereof is determined by the claims that follow.

What is claimed is:

1. A phase interpolator circuit, comprising:
   a decoder having a plurality of inputs configured to receive binary codes and a respective plurality of outputs configured to output thermometer codes;
   a pre-mixer configured to receive input clock signals and provide pre-mixed clock signals, the pre-mixer segmented into a plurality of unit circuits that are enabled or disabled based on bits of a first pre-mixer thermometer code of the thermometer codes;
   a mixer configured to receive the pre-mixed clock signals and provide mixed clock signals, the mixer segmented into a plurality of unit circuits that are enabled or disabled based on bits of a first mixer thermometer code of the thermometer codes; and
   a post-mixer configured to receive the mixed clock signals and provide output clock signals, the post-mixer segmented into a plurality of unit circuits that are enabled or disabled based on bits of a first post-mixer thermometer code of the thermometer codes.

2. The phase interpolator circuit of claim 1, wherein each of the plurality of unit circuits of the pre-mixer, each of the plurality of unit circuits of the mixer, and each of the plurality of unit circuits of the post-mixer comprises a current-mode logic (CML) circuit, each CML circuit including a current source segmented into a plurality of current sources that are enabled or disabled based on bits of a respective second pre-mixer thermometer code, second mixer thermometer code, and second post-mixer thermometer code of the thermometer codes.

3. The phase interpolator circuit of claim 2, wherein each CML circuit in the pre-mixer includes a capacitor bank segmented into a plurality of capacitors that are enabled or disabled based on bits of a third pre-mixer thermometer code of the thermometer codes.

4. The phase interpolator circuit of claim 2, wherein each CML circuit in the mixer is coupled to a resistor bank segmented into a plurality of resistors that are enabled or disabled based on bits of a third mixer thermometer code of the thermometer codes.

5. The phase interpolator circuit of claim 2, wherein the CML circuits in the pre-mixer, the mixer, and the post-mixer comprise differential transistor pairs having primary current sources, the primary current sources in the pre-mixer, the mixer, and the post-mixer enabled or disabled by the bits of the first pre-mixer thermometer code, the first mixer thermometer code, and the first post-mixer thermometer code, respectively.

6. The phase interpolator circuit of claim 5, wherein the primary current sources in the pre-mixer, the mixer, and the post-mixer are in parallel with the segmented current sources in the pre-mixer, the mixer, and the post-mixer, respectively.

7. The phase interpolator circuit of claim 1, further comprising:
   an adaptation circuit configured to receive the pre-mixed clock signals, the mixed clock signals, and the output clock signals and to generate the binary codes in response thereto.

8. A clock delivery system, comprising:
   a phase-locked loop (PLL) configured to generate a plurality of input clocks;
   a phase interpolator configured to receive the plurality of input clocks and generate a plurality of output clocks; and
   a clock data recovery (CDR) circuit configured to receive the plurality of output clocks;
   wherein the phase interpolator includes:
      a decoder having a plurality of inputs configured to receive binary codes and a respective plurality of outputs configured to output thermometer codes;
      a mixer circuitry segmented into a plurality of unit circuits that are enabled or disabled based on bits of the thermometer codes.

9. The clock delivery system of claim 8, wherein the mixer circuitry comprises:
   a pre-mixer configured to receive the input clock signals and provide pre-mixed clock signals, the pre-mixer segmented into a plurality of pre-mixer unit circuits that are enabled or disabled based on bits of a first pre-mixer thermometer code of the thermometer codes;
   a mixer configured to receive the pre-mixed clock signals and provide mixed clock signals, the mixer segmented into a plurality of mixer unit circuits that are enabled or disabled based on bits of a first mixer thermometer code of the thermometer codes; and
   a post-mixer configured to receive the mixed clock signals and provide the output clock signals, the post-mixer segmented into a plurality of post-mixer unit circuits that are enabled or disabled based on bits of a first post-mixer thermometer code of the thermometer codes.

10. The clock delivery system of claim 9, wherein each of the plurality of pre-mixer unit circuits of the pre-mixer, each of the plurality of mixer unit circuits of the mixer, and each of the plurality of post-mixer unit circuits of the post-mixer comprises a current-mode logic (CML) circuit, each CML circuit including a current source segmented into a plurality of current sources that are enabled or disabled based on bits of a respective second pre-mixer thermometer code, second mixer thermometer code, and second post-mixer thermometer code of the thermometer codes.

11. The clock delivery system of claim 10, wherein each CML circuit in the pre-mixer includes a capacitor bank segmented into a plurality of capacitors that are enabled or disabled based on bits of a third pre-mixer thermometer code of the thermometer codes.

12. The clock delivery system of claim 10, wherein each CML circuit in the mixer is coupled to a resistor bank segmented into a plurality of resistors that are enabled or disabled based on bits of a third mixer thermometer code of the thermometer codes.

13. The clock delivery system of claim 10, wherein the CML circuits in the pre-mixer, the mixer, and the post-mixer comprise differential transistor pairs having primary current sources, the primary current sources in the pre-mixer, the mixer, and the post-mixer enabled or disabled by the bits of the first pre-mixer thermometer code, the first mixer thermometer code, and the first post-mixer thermometer code, respectively.

14. The clock delivery system of claim 13, wherein the primary current sources in the pre-mixer, the mixer, and the post-mixer are in parallel with the segmented current sources in the pre-mixer, the mixer, and the post-mixer, respectively.

15. The clock delivery system of claim 9, wherein the phase interpolator further comprises:
an adaptation circuit configured to receive the pre-mixed clock signals, the mixed clock signals, and the output clock signals and to generate the binary codes in response thereto.

16. A method of clock phase interpolation, comprising:
converting a plurality of binary codes into a respective plurality of thermometer codes;
pre-mixing input clock signals to provide pre-mixed clock signals;
mixing the pre-mixed clock signals to provide mixed clock signals;
post-mixing the mixed clock signals to provide output clock signals;
enabling one or more pre-mixer unit circuits based on bits of a first pre-mixer thermometer code of the thermometer codes;
enabling one or more mixer unit circuits based on bits of a first mixer thermometer code of the thermometer codes; and
enabling one or more post-mixer unit circuits based on bits of a first post-mixer thermometer code of the thermometer codes.

17. The method of claim 16, further comprising:
enabling one or more sub-range current sources in current-mode logic (CML) circuits in the enabled pre-mixer unit circuits, the enabled mixer unit circuits, and the enabled post-mixer unit circuits based on bits of a respective second pre-mixer thermometer code, second mixer thermometer code, and second post-mixer thermometer code of the thermometer codes.

18. The method of claim 17, further comprising:
enabling one or more capacitors in the enabled pre-mixer unit circuits based on bits of a third pre-mixer thermometer code of the thermometer codes.

19. The method of claim 17, further comprising:
enabling resistors in the enabled mixer unit circuits based on bits of a third mixer thermometer code of the thermometer codes.

20. The method of claim of 16, further comprising:
generating the binary codes in response to the pre-mixed clock signals, the mixed clock signals, and the output clock signals.

* * * * *